United States Patent [19]
Jallice et al.

[11] Patent Number: 5,592,426
[45] Date of Patent: Jan. 7, 1997

[54] EXTENDED SEGMENTED PRECHARGE ARCHITECTURE

[75] Inventors: Derwin L. Jallice, Reston, Va.; Christopher M. Durham; Michael K. Ciraula, both of Austin, Tex.

[73] Assignee: International Business Machines Corporation, Armonk, N.Y.

[21] Appl. No.: 429,441

[22] Filed: Apr. 27, 1995

Related U.S. Application Data

[63] Continuation of Ser. No. 142,991, Oct. 29, 1993, abandoned.

[51] Int. Cl.⁶ .................................................. G11C 7/00
[52] U.S. Cl. .................... 365/203; 365/202; 365/233.5; 365/230.08; 365/238.5; 365/230.03
[58] Field of Search .................................. 365/203, 202, 365/233.5, 230.08, 238.5, 230.03, 227

[56] References Cited

U.S. PATENT DOCUMENTS

| | | | |
|---|---|---|---|
| 4,520,465 | 5/1985 | Sood | 365/203 |
| 4,658,381 | 4/1987 | Reed et al. | 365/203 |
| 4,661,931 | 4/1987 | Flannagan et al. | 365/203 |
| 4,932,001 | 6/1990 | Chow et al. | 365/233.5 |
| 4,969,125 | 11/1990 | Ciraula et al. | 365/203 |
| 4,972,373 | 11/1990 | Kim et al. | 365/203 |

FOREIGN PATENT DOCUMENTS

| | | | |
|---|---|---|---|
| 198186 | 4/1989 | Japan | 365/203 |

*Primary Examiner*—David C. Nelms
*Assistant Examiner*—Andrew Q. Tran
*Attorney, Agent, or Firm*—Robert A. Walsh

[57] ABSTRACT

An extended segmented precharge architecture for static random access memories includes a logic circuitry on an SRAM chip to keep track as to whether a given bit line has been read out. As long as a given bit line has not been read out, precharge of the equalization lines is eliminated thereby increasing access cycle time and reducing power dissipation. The architecture can be applied to any size SRAM of any organization.

4 Claims, 3 Drawing Sheets

EXTENDED SEGMENTED PRECHARGE ARCHITECTURE

This application is a continuation of application Ser. No. 08/142,991, filed Oct. 29, 1993, now abandoned.

BACKGROUND OF THE INVENTION

1. Technical Field

This invention disclosed broadly, relates to memory technology and more particularly, relates to improved static random access memory arrays.

2. Background Art

The segmented precharge architecture is an extension of the segmented word line architecture. This scheme reduces power dissipation by reducing the number of active columns (bit Lines). The vast majority of SRAMs equal to or larger than 64K use the segmented word line architecture.

Existing static RAMs are organized into storage cells which are driven by word lines and which are sensed by bit lines. In order to sense a memory cell, the bit lines have to be previously charged to a predetermined state so that once the cell is read out, it can charge the bit lines so that they can be read by the sense amplifier. In the prior art, each time a word line is driven, the bit lines have their storage charges reset prior to the word line actually reading out the states of the storage cells. The time necessary to reset the bit lines is called the bit line reset time or bit line precharge time.

Static RAMS are typically organized so that the word lines are organized in sections, for example, eight bytes. Each time a section is interrogated in the prior art, all eight word lines are driven and all of the bit lines in that section are also enabled. The precharging of the word lines uses power and takes bit line precharge time.

What is needed is an extension of the static page/column access mode across the full address space of a memory so as to increase access speed and reduce power dissipation. It is desirable that the extended segmented precharge architecture can be applied to a SRAM of any size or organization.

SUMMARY OF THE INVENTION

It is therefore an object of the invention to provide an improved memory array. It is another object of the invention to provide an improved memory array which has increased memory access speed. It is another object of the invention to provide an improved memory array which has reduced power dissipation. The present invention may be applied to any size of SRAM of any organization.

These and other objects, features and advantages of the present invention are accomplished by an extended asynchronous segmented precharge architecture having a logic control to keep track of whether a given bit line has been previously read out. As long as the given bit line has not been read out, there is no necessity to renew the precharge and therefore no necessity to wait for the bit line cycle time. Keeping track of which bit lines have not been enabled is accomplished by a logic controller which keeps track of which sections have not been interrogated. If consecutive accesses of the memory are to different sections, then there is no necessity to undergo another precharge cycle, since the bit lines to be interrogated in the next full section still retain a valid precharge. Precharging of the bit line only occurs if the word (row) address changes and the access requires the memory to remain in the same memory segment. This significantly reduces the power consumption and increases access speed of the memory chip by not requiring the precharge time for many more access cycles during normal chip operation thereby increasing the page mode memory space.

BRIEF DESCRIPTIONS OF THE DRAWINGS

DESCRIPTION OF THE PREFERRED EMBODIMENT

Asynchronous devices require internal clock generator circuits in most cases. One prevalent method of generating the internal clock signals is Address Transition Detection (ATD), which is a especially prominent in Static Random Access Memories (SRAMs). An ATD circuit creates an output pulse, or clock signal, when the input signal changes logic state. The clock signal is then used to initiate the internal timing sequence for an access.

Figure 1:
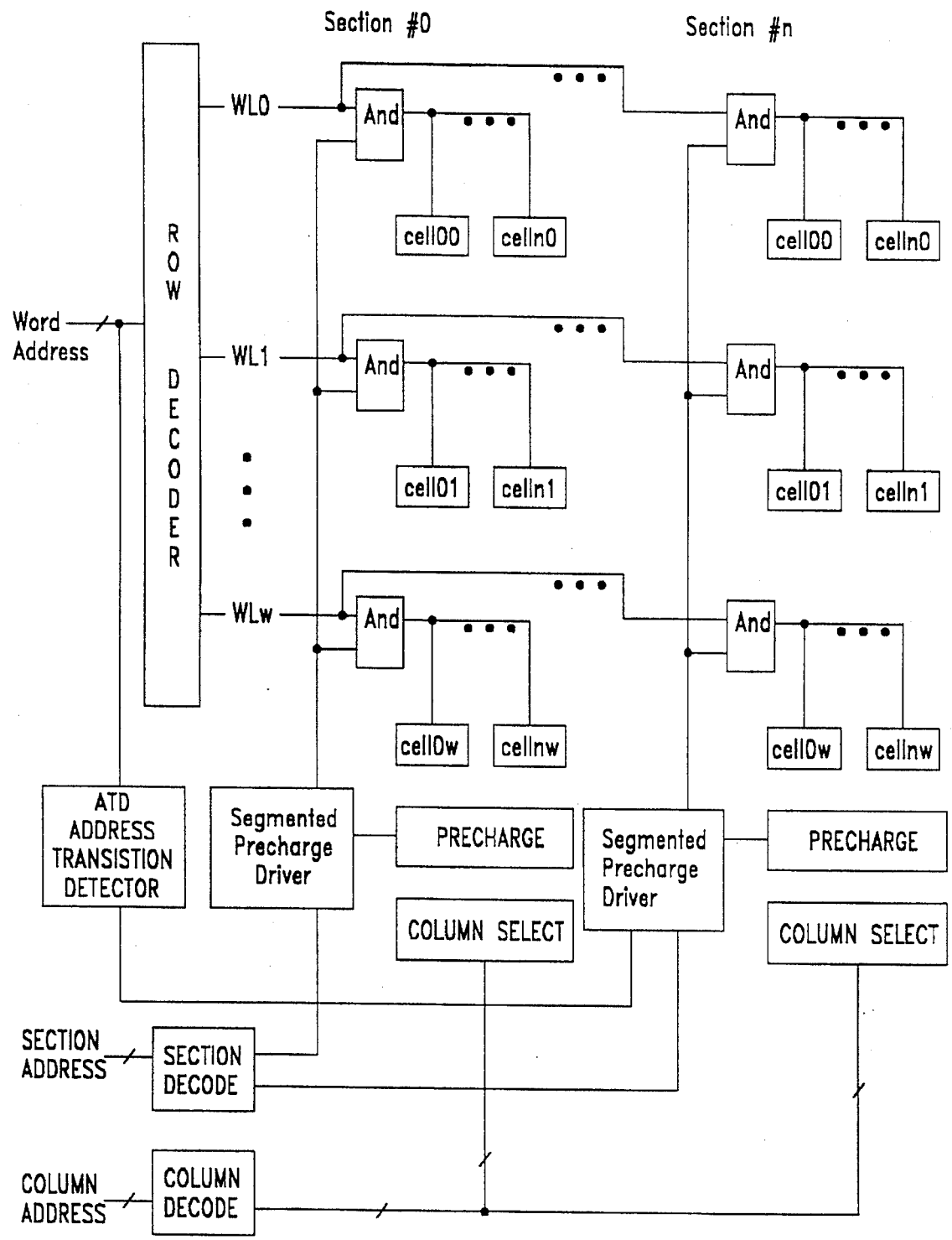
FIG. 1 is a circuit diagram of the prior art segmented precharge architecture.

A previous invention, U.S. Pat. No. 4,969,125, entitled "Asynchronous Segmented Precharged Architecture" issued to Ciraula et al. on Nov. 6, 1990, and assigned to IBM utilized the ATD concept to provide localized control of chip timing within segments and provided a fast "Static Page Mode" feature. The teaching of this patent is herein incorporated by reference. The segmented precharge architecture of that invention is shown in FIG. 1.

Since generating an ATD pulse can extend the read cycle, an ATD pulse is generated only when absolutely necessary. For this reason the column addresses do not feed the ATD circuit, and changing a column address does not cause an ATD pulse. Eliminating the ATD pulse from the column access, produces a column access that is faster than a row access. The fast column access is termed "Static Page Mode". In the active segment all cells in the row are active. The memory can then be accessed by just cycling the column addresses, since the cells are active the bit lines are charged to the desired state. Whereas on a row to row access the bit lines get charged to the desired state after the precharge cycle has been completed. A fast access is achieved because the cells are already active and can be accessed by just changing the column address only. Also, since the column addresses are a smaller subset of the full array address the decode is faster because there are fewer levels of logic gates required to decode a column state. The static page mode feature is extended across section boundaries. This occurs because the unselected sections are in precharge. Therefore an ATD pulse is not required to initiate an access. Only the section address change is required. In this access mode the number of array bits that can be read out in this manner are n(the number of columns in a segment)×m(the number of segments in the array).

The present invention extends the static page mode feature across the full address space of the SRAM array. This is accomplished by interrogating the array to determine if the segment being accessed was previously in the precharge state. If so, then an ATD pulse is not generated even though a word line change may have occurred. Under these conditions an ATD pulse is not necessary because the array was already in the precharge state. Thus, the static page mode feature can be extended to word line accesses in addition to column and section addresses. Therefore, the full address space of the array can be accessed in a totally static state. The next section describes the circuits that are required to achieve this operation.

Figure 2:
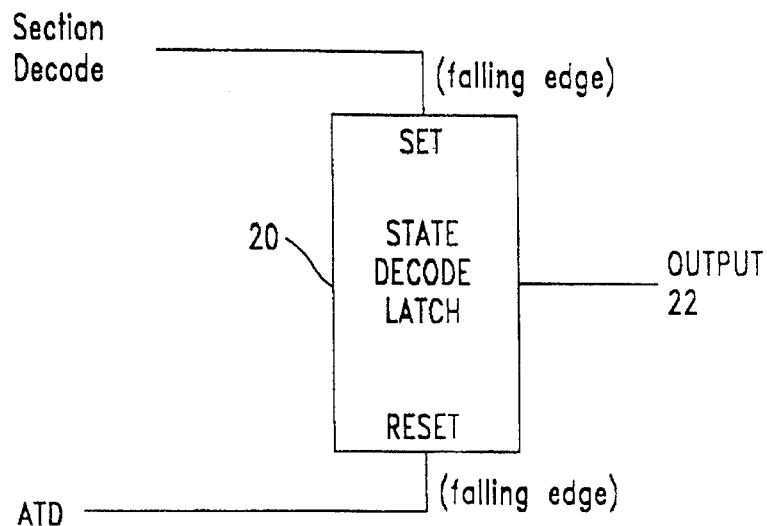
FIG. 2 is a diagram of the logic control to implement the present invention.

To extend the static page mode feature across the entire address space it is necessary to keep track of whether a given section has been in a precharge state. This can be accomplished by establishing a section state decode bit. This can be implemented with a set/reset latch 20 as shown in FIG. 2. When a section access has been completed the state of the latch will be set to indicate that an access has occurred. The falling edge of the section decode is the signal that determines this state. This indicates that the access to this section has been completed. The latch will be reset by the falling edge of the ATD Pulse.

Figure 3A:
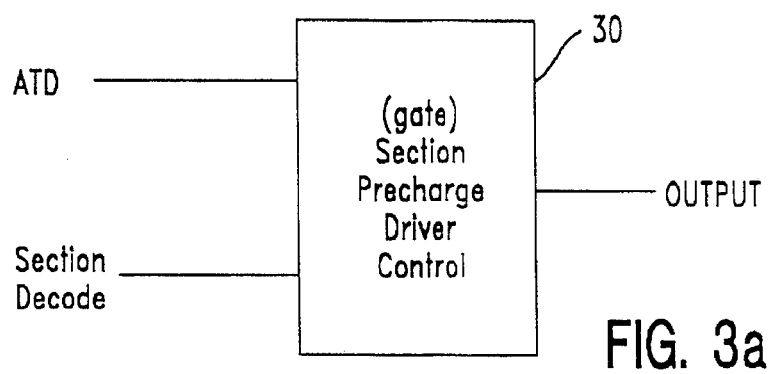
FIG. 3(a) is a showing of the prior art segmented precharge logic control.
Figure 3B:
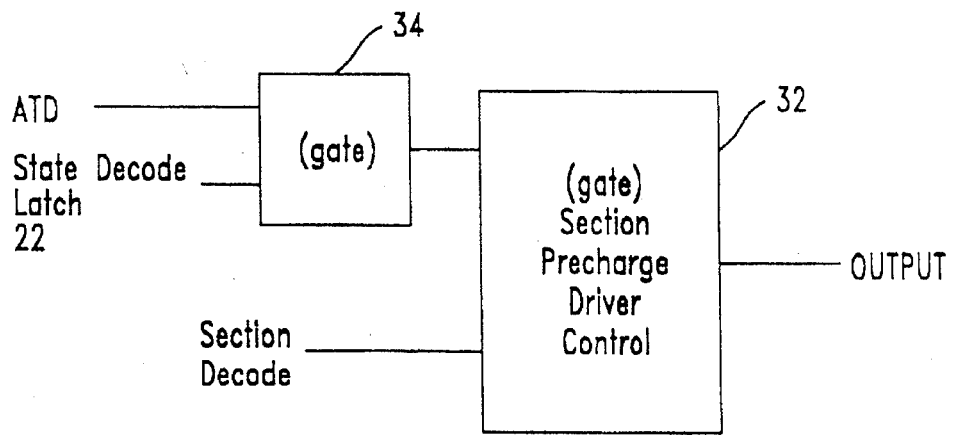
FIG. 3(b) is a diagram of the logic control for the extended segmented precharge architecture according to the present invention.

The output 22 of set/reset latch 20 is used to control the segmented precharge driver as shown in FIG. 3(*b*). In the prior art, the section decode signal was logically combined in gate 30 with the ATD pulse to generate the precharge signal (See FIG. 3*a*). When the section was not selected precharge driver 30 was active. When the ATD pulse was active (low) precharge driver 30 was active. In the present invention, as shown in FIG. 3(*b*), the ATD pulse is gated with the output 22 of the state decode latch 20 in gate 34, the output of which is logically combined in gate 32 with the section decode signal.

Figure 4:
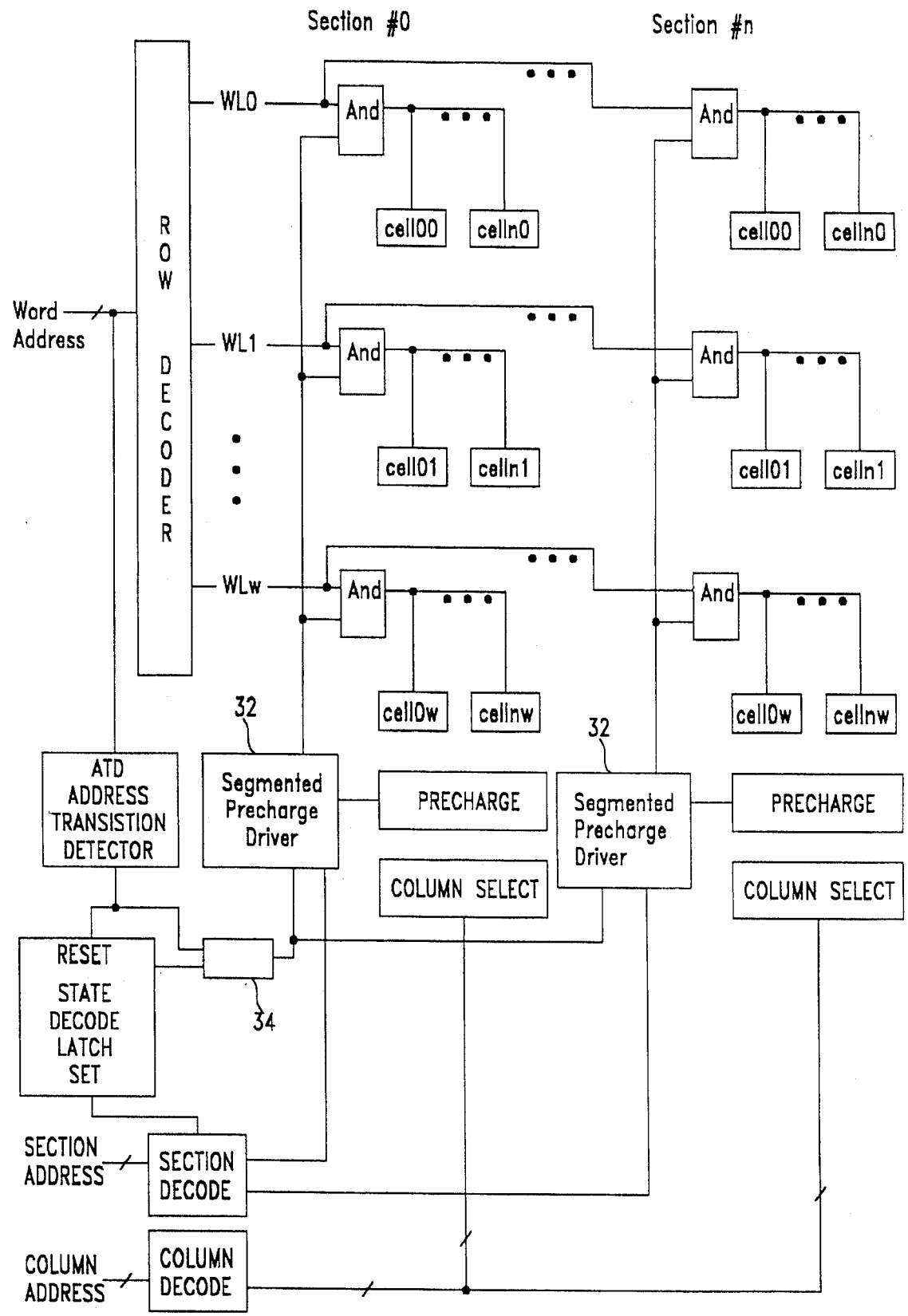
FIG. 4 is a diagram of a SRAM containing the extended segmented precharge architecture according to the present invention.

The complete extended segmented precharge architecture is shown in FIG. 4. When a row access change occurs and the same section is being accessed an ATD pulse is generated. This is the normal mode of operation for a row access change. When a segment access occurs all bits in that segment can be accessed by changing the column bits. This gives a fast "Page Mode Access". No ATD is generated under these conditions. When a segment address is changed, all bits in the new segment can be accessed by changing the column address bits. The extended segmented precharge access occurs when a word address changes and a previously precharged segment is being accessed. The state decode latch is active because the segment was in precharge. The ATD pulse is inhibited by the output of the state decode latch. Now all cells in that array segment are accessible by changing the column addresses. The falling edge of the ATD resets the state decode latch so that normal word accesses can occur in the selected segment. When the segment access is complete the latch is set by the falling edge of the segment decode. Since the word address can be accessed in a static mode the number of bits that can be statically accessed in the array equal w(number of rows in the array)×n(number of columns in a section)×m(number of sections in the array), which equals the full address space of the array.

What has been shown is an extended segmented precharge architecture providing a new SRAM design which provides static column mode for the full SRAM address space. The design provides increased access speed and reduced power dissipation. The present invention can be applied to SRAMs of any size or organization.

While the invention has been particularly shown and described with reference to the preferred embodiment, it will be understood that various changes of form and detail can be made therein without departing from the spirit and scope of the appended claims.

What is claimed is:

1. A memory array having row address inputs connected to a row address decoder and column address inputs connected to a column address decoder, said memory array including word lines organized into rows and a plurality of bit line pairs organized into columns, each bit line pair being associated with a column, said memory array comprising:

a plurality of segments, each segment containing a portion of said plurality of bit line pairs;

a precharge circuit coupled to each of said plurality of segments for precharging and equalizing a potential on each bit line in a bit line pair of a given segment;

an address transition detection circuit having an input coupled to said row address inputs, said address transition detection circuit detecting a row address transition and outputting an address transition signal when said row address transition is detected;

a segment address decoder for decoding an address of a selected segment;

logic circuitry having a first input coupled to an output of said address transition detection circuit for receiving said address transition signal and a second input coupled to an output of said segment address decoder, said logic circuitry determining whether precharging of said selected segment is necessary; and a controller for each precharge circuit having a first input coupled to an output of said logic circuitry, a second input coupled to said segment address decoder and an output coupled to said precharge circuit, said controller activating said precharge circuit only if said logic circuitry determines that said address transition signal was received and said selected segment was immediately previously selected.

2. The memory array of claim 1 wherein said logic circuitry comprises a state decode latch set by a segment address decoder signal and reset by said address transition signal.

3. The memory array of claim 2 wherein said logic circuitry further comprises a gate having a first input coupled to said output of said address transition detection circuit, a second input coupled to an output of said state decode latch and an output corresponding to said output of said logic circuitry.

4. A method for accessing a memory array including a plurality of memory cells arranged in rows and columns, said columns being combined into segments, each column corresponding to a bit line pair, wherein bit line pairs in an unselected segment are in a precharged state, said method comprising:

accessing a first memory cell in a given segment;

accessing a second memory cell in said memory array; and precharging all bit line pairs in said given segment prior to said step of accessing said second memory cell only if said second memory cell corresponds to said given segment and corresponds to a row different than that of said first memory cell.

\* \* \* \* \*